United States Patent [19]

Ellis, Jr. et al.

[11] Patent Number: 4,512,509

[45] Date of Patent: Apr. 23, 1985

[54] TECHNIQUE FOR BONDING A CHIP CARRIER TO A METALLIZED SUBSTRATE

[75] Inventors: Roland Ellis, Jr., Burlington Township, Burlington County; Brian E. Jacobs, Collingswood Township, Camden County, both of N.J.; Edward J. March, Lower Makefield Township, Bucks County, Pa.; Raymond J. Newman, Lawrence Township, Mercer County, N.J.

[73] Assignee: AT&T Technologies, Inc., New York, N.Y.

[21] Appl. No.: 469,662

[22] Filed: Feb. 25, 1983

[51] Int. Cl.³ .................. B23K 31/02; B01J 17/00
[52] U.S. Cl. .................. 228/180.2; 228/49.1
[58] Field of Search .......... 228/180 A, 4.5, 49 R, 228/49 A; 361/403, 417, 400, 397; 29/589, 464, 465, 834

[56] References Cited

U.S. PATENT DOCUMENTS

| | | | |
|---|---|---|---|
| 3,387,365 | 6/1968 | Stelmak | 228/180 R X |
| 3,429,040 | 2/1969 | Miller | 228/180 R X |
| 3,457,639 | 7/1969 | Weller | 29/577 R X |
| 3,480,836 | 11/1969 | Aronstein | 228/180 A X |
| 3,777,221 | 12/1973 | Tatusko et al. | 228/180 A X |
| 3,802,069 | 4/1974 | Thompson | 29/588 X |
| 3,869,787 | 3/1975 | Umbaugh | 228/180 A X |
| 3,871,936 | 3/1975 | Boyer et al. | 228/106 X |
| 3,918,146 | 11/1975 | Hartleroad et al. | 228/180 A X |
| 3,982,979 | 9/1976 | Hentz et al. | 228/180 R X |
| 4,032,058 | 6/1977 | Riseman | 228/180 A X |
| 4,079,509 | 3/1978 | Jackson et al. | 228/180 A X |
| 4,295,596 | 10/1981 | Doten et al. | 228/180 A |
| 4,334,646 | 6/1982 | Campbell | 228/180 A |
| 4,371,912 | 2/1983 | Guzik | 228/180 A X |

OTHER PUBLICATIONS

"Solder Reflow Face-Up Chip Mounting", *IBM Technical Disclosure Bulletin*, S. Magdo, vol. 19, No. 4, p. 1217, Sep. 1976.

*Primary Examiner*—Nicholas P. Godici
*Attorney, Agent, or Firm*—D. J. Kirk; R. B. Levy

[57] ABSTRACT

A template (148), having at least one opening (152) therein, is placed in close, spaced, relation to a PCB (30). The opening (152) is circular with a small semicircular notch (154) on the periphery thereof. A chip carrier (10) is positioned in the opening (152) with one corner (22) loosely captured in the notch (154). The PCB (30), template (148) and the loosely captured chip carriers (10) are placed in a condensation soldering facility to reflow the solder. As the solder reflows the chip carrier (10) rotates slightly about the loosely captured corner (22) to self align pads (33) on the PCB (30) to leads (16) on the chip carrier (10) as the bond is being formed.

2 Claims, 5 Drawing Figures

TECHNIQUE FOR BONDING A CHIP CARRIER TO A METALLIZED SUBSTRATE

TECHNICAL FIELD

The instant invention is related to bonding articles. In particular, the invention is directed to bonding chip carriers to the surface of metallized substrates.

BACKGROUND OF THE INVENTION

In recent years "chip carriers" have emerged as a promising high-volume device packaging technique. In its simplest form a chip carrier is a substantially square shaped, relatively thin, article having a cavity with bonding pads therein which are connected to a plurality of electrically conductive leads that extend through the chip carrier body and terminate on the underside thereof. The conductive leads may be solid conductor wire (commonly referred to as leaded) or plated leads (commonly referred to as leadless). A semiconductor circuit chip is placed in the cavity, connected to the bonding pads and a cover placed over the cavity to hermetically seal the semiconductor chip therein.

A plurality of such chip carriers may be soldered to electrically conductive bonding pads on the surface of a Printed Circuit Board (PCB). The pads and/or the leads may have predeposited amounts of solder thereon or, alternatively, a solder preform may be interposed between each pad and its associated lead. The leads, solder, and the pads are then placed in contact and the solder reflowed to effect the bond.

Various techniques have been used to reflow the solder to form such a surface bond. Belt furnaces and condensation soldering presently are the most widely used techniques for simultaneously bonding one or more of chip carriers to the pads on the PCB.

When placing chip carriers on the surface of a PCB it is well known to use an aluminum or stainless steel template, with the required number of square aperatures machined therein, to maintain alignment of the chip carriers to bonding pad arrays on the PCB. The template is placed proximate the surface of the substrate and the chip carriers placed therein and the solder reflowed to form the desired bond. Such square apertures are expensive to fabricate. Additionally, when condensation soldering is used to form the bond, the hot saturated vapor has limited accessability to the bonding sites because the space between the sides of the chip carriers and the edges of the apertures is very small in order to maintain alignment between the leads and the bonding pads. Additionally, liquid condensate drainage in the vicinity of the bond site is reduced allowing a liquid film to isolate vapor from the solder being melted which slows down the heating operation.

Furthermore, it is most desirable to simultaneously bond chip carriers on both sides of the PCB. In order to accomplish the surface mounting of chip carriers on a PCB using a belt furnace it is necessary to pass the PCB through the furnace in a first pass to bond the carriers to one side and then turn the PCB over, place the chip carriers thereon, and make a second pass to bond the remaining carriers. Such a two-step approach is time consuming, expensive and reduces the strength of the solder bond which was heated twice causing dissolution of a portion of the substrate metallization into the molten solder. Heretofore, condensation soldering has only been effective for bonding the chip carriers to one side of the PCB.

Accordingly, there is a need for a method and apparatus for orienting and aligning chip carrier leads to bonding pads on both upper and lower surfaces of a PCB during reflow soldering. Further, there is a need for a technique for simultaneously surface bonding of chip carriers to both sides of a PCB.

SUMMARY OF THE INVENTION

The instant invention overcomes the foregoing problem of bonding leads of a substantially square chip carrier having leads thereon to respective bonding pads on a metallized substrate, at least one of which has a predeposited reflowable bonding material thereon. The method comprises the steps of roughly aligning the chip carrier leads to the respective bonding pads; loosely capturing one corner of the chip carrier; reflowing the bonding material to self align the leads to the land areas by permitting free rotation of the chip carrier about the loosely captured corner; and solidifying the material to form the bond.

DETAILED DESCRIPTION

Figure 1:
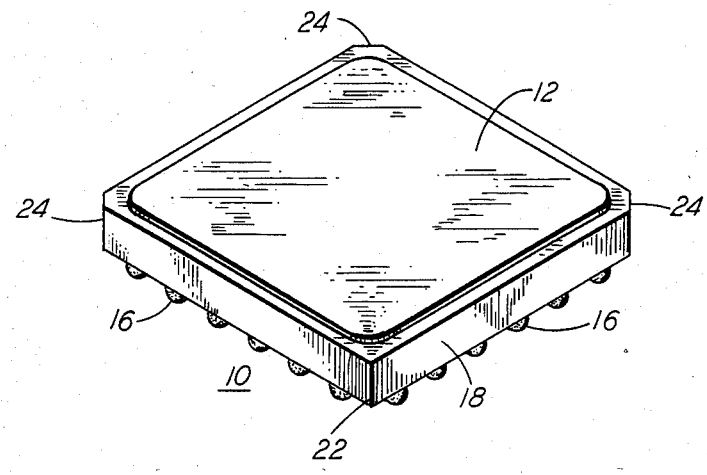
FIG. 1 is an isometric top view of a chip carrier.
Figure 2:
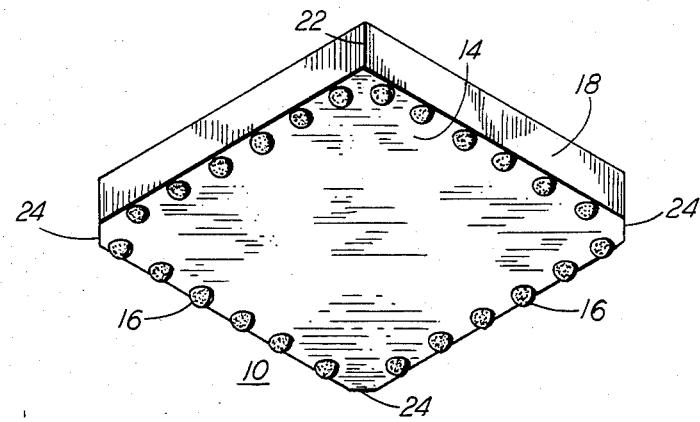
FIG. 2 is an isometric bottom view of a chip carrier.

FIG. 1 is an isometric view of a chip carrier generally designated by the numeral 10. The chip carrier 10 has a generally square, substantially planar, body 12 with leads that extend through the bottom 14 which may be coated with solder bumps 16 as shown in FIG. 2. The carrier 10 has planar sides 18—18 which terminate in corners, one corner 22 is substantially at a right angle and the other three corners ≧—24 being shaved at an angle of about 45°. The right angle corner 22 is normally used to locate the carrier 10 in a predetermined orientation on a substrate.

Figure 3:
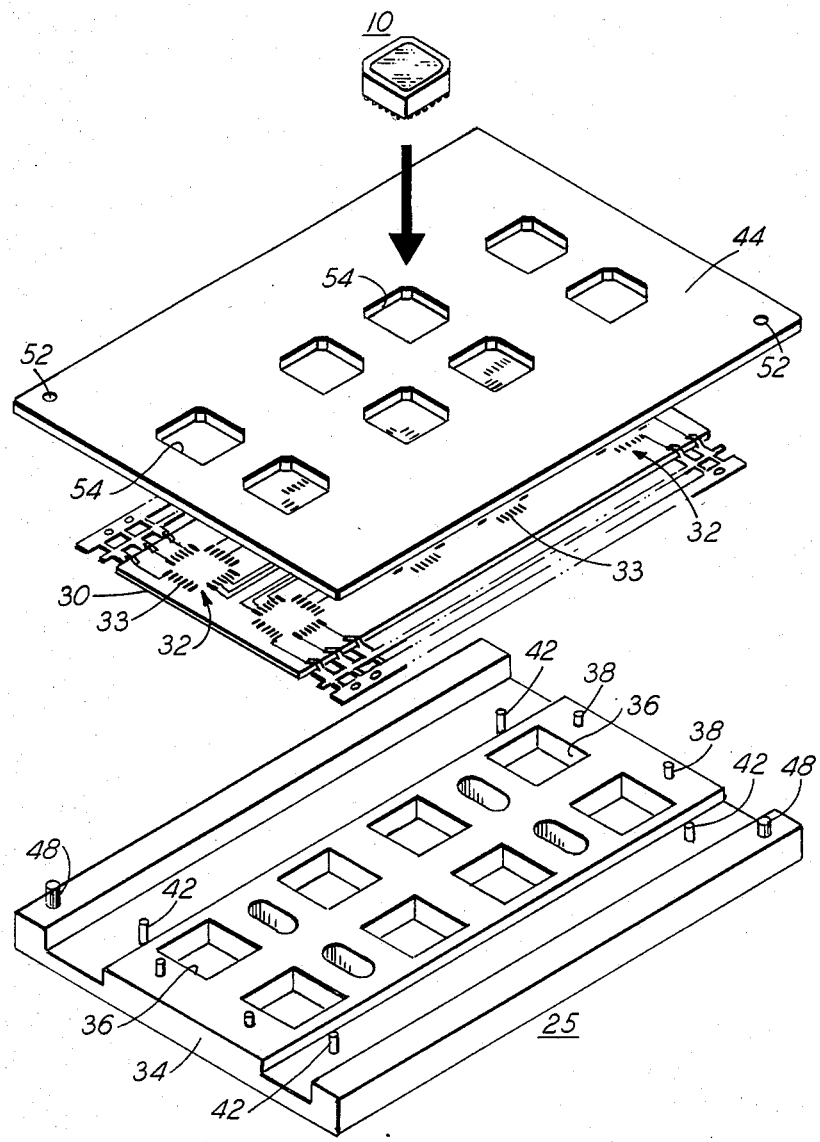
FIG. 3 is an isometric view of a prior art apparatus used to align chip carriers to bonding pads on a PCB.

FIG. 3 is an exploded view of a prior art apparatus 25 used to hold chip carriers 10—10 in position on one side of a ceramic PCB 30 as the carriers are soldered to a plurality of arrays 32—32 of electrically conductive bonding pads 33—33. The PCB is placed in a metallic holder 34 having a plurality of openings 36—36 therein. The PCB 30 rests on pins 38—38 and is held in place by pins 42—42. Once the PCB 30 is positioned in the holder 34 a top plate 44 is placed thereover and is aligned to the substrate 30 and the holder 34 by inserting pins 48—48 in apertures 52—52 to place openings 54—54 in alignment with the bonding pad arrays 32—32. Chip carriers 10—10 (only one shown) are then placed into the openings 54—54 causing the solder coated leads 16—16 to contact the respective pads 33—33 in each array 32. The apparatus 25 is then placed in a belt furnace. A substantial portion of the heat passing through the openings 36—36 to reflow the solder coated leads 16—16 to bond the chip carriers 10—10 to the land arrays 32—32 on the PCB 30.

Although the apparatus 25 has performed well, problems arise when condensation soldering is used to reflow the solder, for the tolerances between the sides of the openings 54—54 and the sides 18—18 of the chip carriers 10—10 are very close to provide accurate alignment between the leads 16—16 and the lands 33—33. However, such close tolerances inhibit flow of hot vapor to the bond site as well as the draining of liquid condensate from around the solder interconnection area, resulting in poor solder connections. Additionally, the apparatus 25 permits bonding of chip carriers 10 to only one side of the PCB 30. Thus, when processing double sided PCB's 30 it is necessary to make a second soldering pass after removing and inverting the PCB in the apparatus 25.

Figure 4:
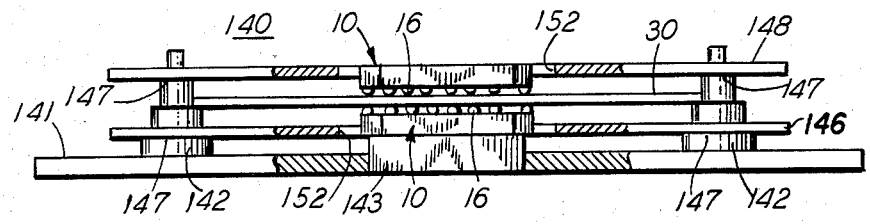
FIG. 4 and FIG. 5 are elevation and plan views, respectively, of the instant chip carrier alignment apparatus.
Figure 5:
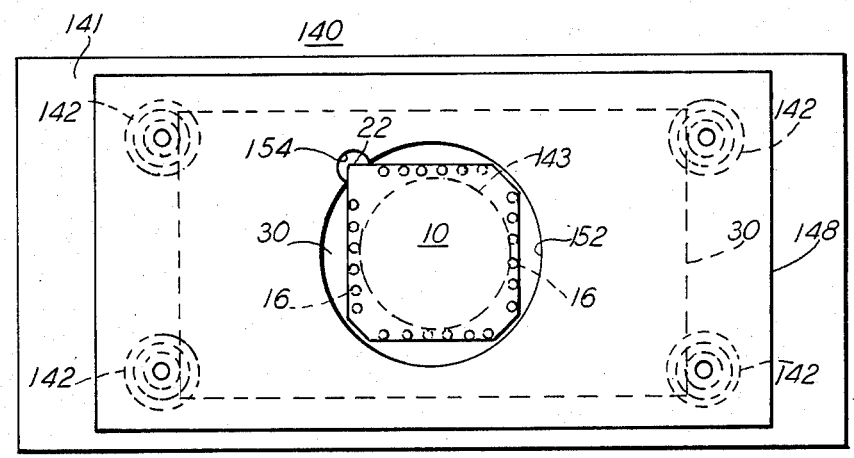

The instant apparatus 140 shown in FIGS. 4 and 5 overcomes the foregoing problems. The apparatus 140 is comprised of a baseplate 141 with a plurality of upstanding fixture supports 142 and chip carrier pillar support 143 upwardly extending from the baseplate. Lower and upper locating templates 146 and 148 respectively are positioned on the appropriate shoulders 147—147 of the fixture supports 142—142 in parallel, spaced relation. Each of the plates 146 and 148 have a circular opening 152 therein with a further, substantially semicircular, locating notch 154 on the periphery of the opening.

In operation, the lower template 146 is positioned on the lower shoulders 147—147 of the supports 142—142. A first chip carrier 10 having solder coated leads or bumps 16—16 is placed on the support 143, inside the opening 152 of the plate 146 with the orientation corner 22 projecting into, and loosely captured by the notch 154 which provides a rough alignment of the solder coated leads 16—16 with the pads 33—33 (see FIG. 3) on the substrate 30. The metallized substrate 30 is then positioned over the first chip carrier 10 and the upper locating place 148 put into position and a second chip carrier placed in the opening 152 with the orientation corner 22 loosely captured in the notch 154.

The assembled apparatus is then placed in hot saturated vapor in a condensation soldering facility (not shown). The solder on the leads 16—16 (or preform, if used) melt and form a bond to the respective pads 33—33. If there was an initial misalignment between the solder coated leads 16—16 and the pads 33—33 the chip carrier 10, which is free to rotate or pivot slightly about the corner 22 in the notch 154, will move due to surface tension of the molten solder to self align the leads with the pads. After the solder reflows the apparatus 140 is removed from the condensation soldering facility and the substrate 30 with the chip carriers 10—10 bonded thereto are removed.

It is to be understood that the embodiments described herein are merely illustrative of the principles of the invention. Various modifications may be made thereto by persons skilled in the art which embody the principles of the invention and fall within the spirit and scope thereof. For instance, either the leads 16—16 and/or the pads 33—33 may be solder coated or a solder preform placed therebetween to form the bond.

Additionally, although the apparatus 140 was designed to simultaneously bond chip carriers 10—10 to both sides of a PWB, it is clear that bonding the carriers to a single side can readily be effected.

What is claimed is:

1. A method of bonding leads of a substantially square chip carrier to respective bonding pads on a planar metallized substrate, a predeposited reflowable bonding material being interposed between the pads and leads; the method comprising the steps of:

roughly aligning the chip carrier leads to the respective bonding pads on a first major surface of the planar substrate;

loosely capturing a corner of the chip carrier in a notch of a circular aperture in a template overlying the substrate;

reflowing the bonding material to self align the leads to the pads by permitting free rotation of the chip carrier about the loosely captured corner; and solidifying the material to form the bond.

2. The method as set forth in claim 1, wherein the substrate is metallized on both major surfaces of the planar substrate, the method further comprising the steps of:

roughly aligning chip carrier leads to the respective bonding pads on the second major surface of the planar substrate;

loosely capturing a corner of the chip carriers on the second major surface in a notch of a circular aperture in a template overlying the substrate;

reflowing the bonding material to simultaneously self align the leads to the pads by permitting free rotation of the chip carrier about the loosely captured corner; and solidifying the material to form the bonds.

* * * * *